(12) United States Patent
Doorandish

(10) Patent No.: US 10,910,855 B2
(45) Date of Patent: Feb. 2, 2021

(54) WEARABLE MULTIFUNCTION POWER BANK

(71) Applicant: Seyed Mehdi Doorandish, Canoga Park, CA (US)

(72) Inventor: Seyed Mehdi Doorandish, Canoga Park, CA (US)

( * ) Notice: Subject to any disclaimer, the term of this patent is extended or adjusted under 35 U.S.C. 154(b) by 97 days.

(21) Appl. No.: 16/147,843

(22) Filed: Sep. 30, 2018

(65) Prior Publication Data

US 2019/0097445 A1    Mar. 28, 2019

Related U.S. Application Data

(60) Provisional application No. 62/539,148, filed on Jul. 31, 2017.

(51) Int. Cl.
| | | |
|---|---|---|
| *H02J 7/00* | (2006.01) | |
| *H02J 7/35* | (2006.01) | |
| *H02J 7/34* | (2006.01) | |
| *H05K 7/20* | (2006.01) | |
| *A45F 5/02* | (2006.01) | |
| *H05K 5/00* | (2006.01) | |

(52) U.S. Cl.
CPC ............ *H02J 7/0063* (2013.01); *A45F 5/021* (2013.01); *H02J 7/342* (2020.01); *H02J 7/35* (2013.01); *H05K 5/0086* (2013.01); *H05K 7/2039* (2013.01); *A45F 2200/0516* (2013.01); *H02J 7/0042* (2013.01); *Y02E 60/10* (2013.01)

(58) Field of Classification Search
CPC .. H02J 7/0063; H02J 7/342; H02J 7/35; H02J 7/0042; H05K 5/0086; H05K 7/2039; A45F 5/021; A45F 2200/0516
See application file for complete search history.

(56) References Cited

U.S. PATENT DOCUMENTS

| | | | | |
|---|---|---|---|---|
| 4,748,344 A | * | 5/1988 | Sing | F21L 15/10 |
| | | | | 307/149 |
| 4,827,534 A | * | 5/1989 | Haugen | H02S 10/40 |
| | | | | 2/108 |
| 5,914,585 A | * | 6/1999 | Grabon | G06F 1/26 |
| | | | | 320/125 |
| 6,561,845 B2 | * | 5/2003 | Ocheltree | H01R 27/02 |
| | | | | 439/540.1 |
| 9,351,900 B2 | * | 5/2016 | Walsh | B25J 9/0006 |
| 9,743,554 B2 | * | 8/2017 | McLaughlin | H05K 7/2039 |
| 10,112,575 B2 | * | 10/2018 | Piccioni | G06F 1/1632 |
| 10,149,508 B2 | * | 12/2018 | Gonzalez | A45F 5/021 |
| 10,374,661 B2 | * | 8/2019 | Sabacinski | H04B 5/0037 |
| 2016/0359207 A1 | * | 12/2016 | Cornelius | H01M 10/443 |
| 2018/0202420 A1 | * | 7/2018 | Wong | H02J 7/0063 |
| 2020/0059196 A1 | * | 2/2020 | Thiel | H01M 10/465 |

* cited by examiner

*Primary Examiner* — Michael C Zarroli
(74) *Attorney, Agent, or Firm* — Arabi Law; Mani Arabi

(57) ABSTRACT

A wearable multifunction power bank includes a flexible belt, a rechargeable power source contained within the flexible belt, and one or more electrical modules attached to the belt. The wearable power bank may also include a communications circuit configured to communicate with the one or more electrical modules or other external devices. The one or more electrical modules may be removably attached and modular. The rechargeable power source may be recharged from power generated through the user's motion, such as power generated from the user's walking steps.

17 Claims, 4 Drawing Sheets

WEARABLE MULTIFUNCTION POWER BANK

FIELD OF THE INVENTION

The present invention relates to a multi-utility device. More particularly, the present invention relates to a wearable device that may contain multiple electrical equipment. The equipment may be configured to carry and charge electronic devices, or to derive other useful functions such as light and sound.

BACKGROUND

Gear traditionally designed for outdoor activities is made with traditional equipment in mind (e.g. mechanical equipment). However, with changing times, most users desire to carry with them modern gear. Most of this new equipment comprises electronic devices, such as: mobile phones, smart watches, music players, GPS devices, etc., or safety devices, such as: stun guns, safety lights, safety beacons, or insect repellents for personal protection.

As technology advances and products become increasingly specialized, particularly in the electronic realm, there is an increase in the need for connectivity between devices for a variety of purposes. For example, a user's first electrical device may require a different charging connection (port) than a user's second electrical device; or a user may require one cord for charging the device and a second cord for attaching an apparatus to the device. Another example may be a device requiring one connection (e.g. an AC connection) to charge its battery while connecting to a rescue light or beacon by means of a second (e.g. USB) connection.

Different devices may have different power requirements (and/or require charging at different times or rates). In general, the connectivity requirements of various electrical or electronic devices for various purposes can vary, requiring the user to carry a variety of connections on their purpose. Even when a user manages to carry all of the required components, there is great difficulty in keeping the cords clear of oneself and tangles. In the outdoors or work done in the field, this can be particularly troublesome as space and weight are both limited. Furthermore, the particular electrical needs of users may vary greatly, even among different users within the same field.

Therefore, there is a need for a wearable device configured to connect to a plurality of electronic or electrical equipment. There is an additional need for such a device to be modular, such that its equipment may be matched to the needs of the user.

SUMMARY OF THE INVENTION

The wearable device addresses the above-mentioned need for a device which can connect to other equipment, in order to, for example, charge electronic equipment (e.g. by means of a power source), provide light (e.g. by means of light generating equipment) or sound (e.g. by means of sound generating equipment). The specific features desired may vary depending on the user and/or the (outdoor) activity involved.

Examples relate to a wearable multifunction power bank. The power bank comprises a flexible belt; a rechargeable power source contained within the flexible belt; and one or more electrical modules attached to the belt. The rechargeable power source is configured to provide power to the electrical modules. Such a device enables providing portable power to a number of electrical devices in the field.

In some examples, the wearable multifunction power bank further comprises a communications circuit configured to communicate with the one or more electrical modules or other external devices. For example, the communications circuit may communicate with one or more attached modules, coordinating their use or the communications circuit may enable controls or other usage by means of an external device, such as a mobile phone.

In some examples, the rechargeable power source comprises one or more power cells. Each power cell may be individually housed in an impact or heat resistant housing. In some examples, the individually housed power cells are removably attached to the belt. By separating the power sources into individual cells, the power bank may remain functional even if a cell is damaged in the field. A single damaged cell may be repaired or replaced without needing to replace the entire belt.

In some examples, the power source may be configured to provide power to the electrical modules by at least one of direct wire connection, removable charging cables, outlets, or wireless charging. The power source may be configured to provide power to other device by means of any electrical connections those devices may require, variable by use-cases as needed.

In some examples, the wearable multifunction power bank may further comprise a heat exchanger connected to the power source. The heat exchanger may be configured to dissipate heat from the power source or flexible belt. Any heat generated from the batteries or through the use of electrical modules may be dissipated to avoid overheating of both the devices and the user.

In some examples, the one of the one or more electrical modules may be powered by a source other than the rechargeable power source. A solar module may power a GPS module, avoiding drain on the battery.

In some examples, the one or more of the electrical modules may be housed in at least one modular housing removably attached to the flexible belt. In some examples, the one or more of the utility modules are integrated into the flexible belt. Individual modules may be attached and unneeded modules may be removed as needed by the user and/or various desired activities. If a module is always desired, it may be integrated into the belt instead.

In some examples, the electrical modules may be housed in a protective housing. The housing may provide protection from moisture, physical impact, or other environmental influences that may damage electrical equipment.

In some examples, the one or more electrical modules may comprise: an audio modules, a speaker, a microphone, or an audio I/O circuit, an insect repellant circuit, a TASER (electric stun gun), a light source, a laser beam or a flashlight, a GPS, an emergency locator beacon, charging cables, power outlets, wireless chargers, or a solar panel. The electrical modules may, generally, be any individual device that may be powered or controlled by means of the power source and/or communications circuit respectively.

In some examples, the flexible belt may further comprise a back support. The flexible belt may provide support to the user for carrying other equipment, such as that carried in a backpack worn in addition to the belt.

BRIEF DESCRIPTION OF THE DRAWINGS

Some examples of apparatuses and/or methods will be described in the following by way of example only, and with reference to the accompanying figures, in which.

DETAILED DESCRIPTION OF THE INVENTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
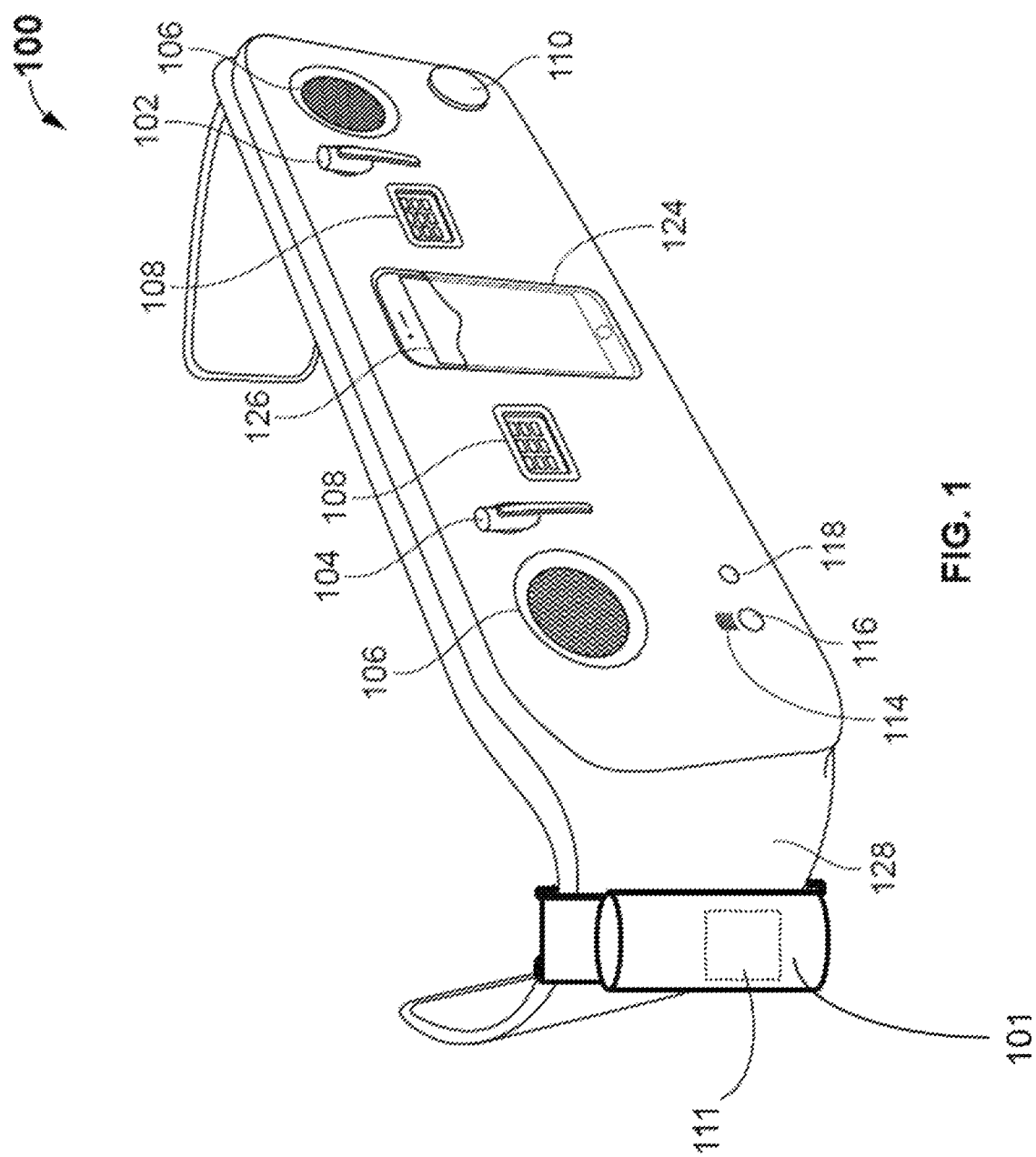
FIG. 1 shows a front perspective view of an example wearable device with both modular and integrated electrical modules.

FIG. 1 shows a front perspective view of an example wearable device 100 with both modular 101 and integrated (e.g. 102, 104) electrical modules. The wearable device 100 comprises a flexible belt 128; a rechargeable power source 130 contained within the flexible belt (see FIG. 2); and one or more electrical modules (such as 102, 104, 106, etc discussed herein) attached to the belt. The rechargeable power source 130 is configured to provide power to the electrical modules (102, 104, 106, etc).

The flexible belt 128 may be made of any flexible material. For example, the flexible belt may be made of cotton, polyester, nylon, or any natural or synthetic material, with preference given to sturdier materials which would withstand outdoor environments. The flexible elongate strip 128 may comprise a fastener or connector structure at one or both ends of a rear side of the elongate strip 128. The connector structure may facilitate to fasten the ends of the elongate strip 128. In other embodiments, the flexible elongate strip 128 may contain internal structures, rather than fasteners (such as internal shaping wires) to retain the shape of the belt around a user comfortably. The flexible property of the elongate strip 128 allows the device 100 to conform around the waist of the user.

The wearable device 100 comprises a rechargeable power source 130. The rechargeable power source is illustrated and discussed in detail with FIG. 2.

The wearable device 100 comprises one or more electrical modules (101, 102, 104, etc). Some electrical modules (for example: 102, 104, 106) may be integrated into the belt 128 while other modules 101 may be housed in at least one modular housing removably attached to the flexible belt. The electronic modules may be attached along a length of the elongate strip 128. The electrical modules may be connected to the rechargeable power source 130 directly (e.g. by wired connections, see FIG. 2). The removably attached electrical modules 101 may attach to the belt by an appropriate fastener (e.g. velcro, magnets, clips, or other fasteners depending on the dimensions of the module); electrically, the modules may attach to the power source by means of various electrical connections 111 provided along the belt 128. For example, modules 101 may plug directly into the belt 128 via electrical connections 111 located along the belt at predetermined locations (e.g. a USB outlet located on the side of belt 128); other modules may plug in to retractable electrical connections 112 (see FIG. 4); still other modules may be directly integrated into the belt 128 and or rechargeable power source 130.

In some embodiments, one, some, or all individual electrical modules may be contained in their own housing 101. A housing may be designed for multiple modules (such as, for example, a housing acting as a switch for multiple devices contained within it, but only a single outward connection). The housing may contain certain electrical connections needed by the device contained within it (such as, for example, power connections or communications connections). The housing may be made of a variety of materials chosen for the particular application of the module; for example, a module designed for extreme outdoor conditions may be made of impact or water resistant materials while a module designed for interior usage (e.g. in a studio) may be chosen for weight. The housing materials may be chosen for their conductivity properties (or lack thereof) or for their physical properties. In some embodiments, the housing 101 may be removably attached to the belt 128.

In some embodiments, one or more of the electrical modules may be powered by a source other than the rechargeable power source 130. Functionality of some modules (e.g. power or other connectivity) may be enabled through the use of further modules. For example, a solar panel module may be connected (either to the belt, directly to another module by means of an appropriate housing/connection, or to another module by means of a connection through the belt). The solar panel module may provide power to the one or more electrical modules that it is connected with in lieu of, or in addition to, the rechargeable power source. The wearable device 100 may further comprise flexible solar panels at the rear side of the elongate strip 128 to allow solar charging of the rechargeable power source and/or other electrical modules.

In various embodiments, the specific electrical modules may vary based on user and activity needs. By means of example only, the wearable device 100 is illustrated containing a number of integrated electrical modules 102, 104, 106, etc. and modular electrical modules 101.

Electrical modules may include, for example, laser pointer 102 (e.g. for aiding in location of a lost user), TASER (electric stun gun) 104 (e.g. for personal protection), and/or a mosquito repellent board 118 (e.g. for warding off mosquitos and other bugs). Other similar safety related modules (not shown) may be, for example, flashlights, GPS locators, or emergency transmitter beacons. The wearable device 100 may enable independent functionality of a variety of critical safety equipment in the field without the user needing to worry about power (or other) needs.

Electrical modules may include, for example, quality of life or entertainment modules as well. The belt 128 may comprise a charging socket 110. The charging socket may provide A/C power, D/C power, or it may provide power through other connection types (e.g. USB; see FIG. 4). The wearable device 100 may comprise a battery indicator 114 and/or a power button 116. The devices status and relevant information may be viewed by means of an indicator 114 directly located on the belt 128. This information may be additionally (or alternatively) transmitted to a users mobile device (e.g. by means of dock 124 or via wireless communication).

The belt 128 may comprise a dock 124 for holding a user's mobile device 126. The dock 124 may further connect the user's device to other modules by means of a communications circuit (see FIG. 2). The dock 124 may further comprise a protective casing (e.g. a water and/or impact resistant casing) for protecting a user's mobile device 126 while it is contained within the belt 128. The protective case of the dock 124 may be transparent and/or conductive (e.g. to allow touch screen functionality therethrough. The dock 124 may further comprise a lever which allows the mobile device 126 to tilt outwards, so that the mobile device 126 would face a user when tilted out.

The belt 128 may comprise speakers 106. The speakers may be wired speakers (e.g. connected to the mobile device via dock 124) or the speakers may be wireless speakers (e.g. BlueTooth or Wifi), allowing any compatible nearby device to wireless connect and play.

Figure 2:
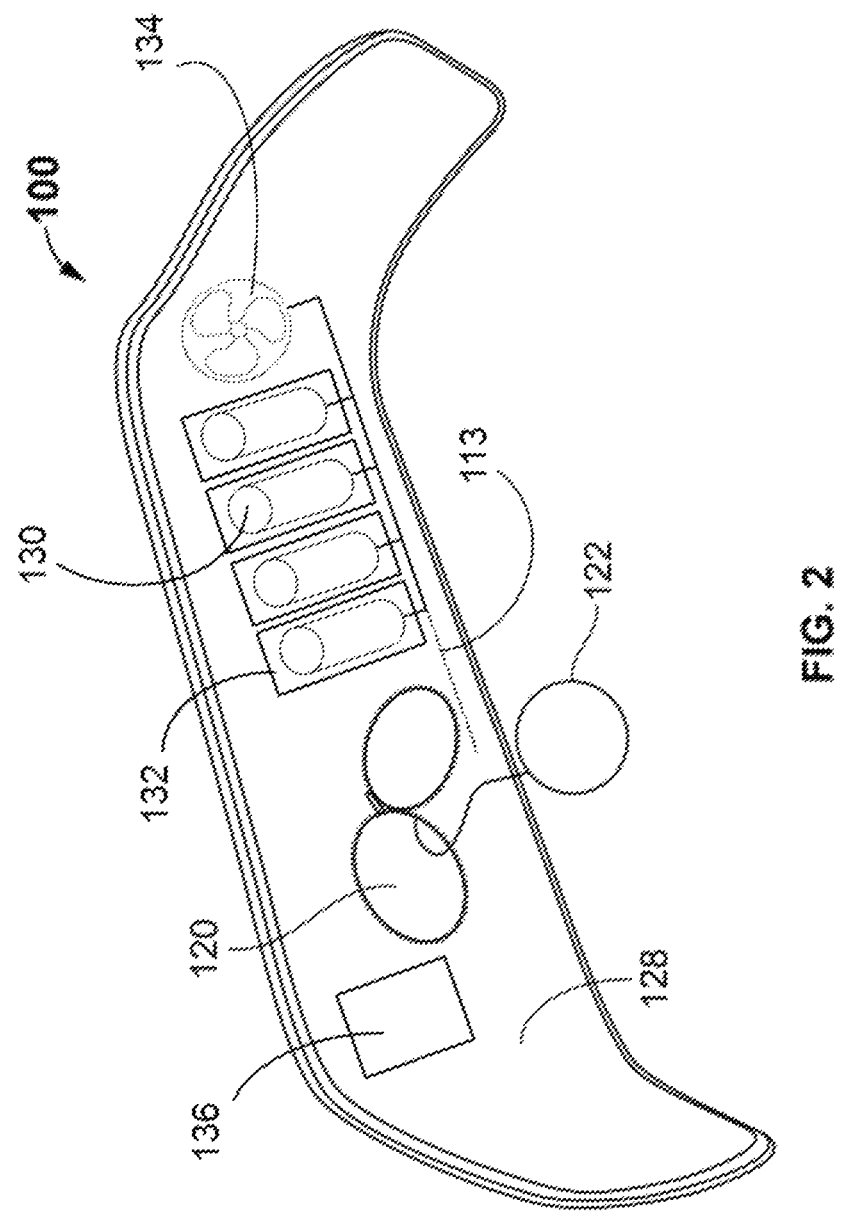
FIG. 2 shows a rear perspective view of an example wearable device.

The wearable device 100 may further comprise switches 108 to control the function of the electrical modules such as TASER (electric stun gun) gun unit 104, laser beam 102, and/or flashlight 120 (see FIG. 2). Additionally or alternatively, the modules may be controlled wirelessly by mobile device 126 (e.g. via the communications circuit).

In some embodiments, non-electrical modules may be removably attached to the belt 128 (e.g. a storage pouch).

FIG. 2 shows a rear perspective view of example wearable device 100. The wearable device 100 comprises rechargeable power source 130. The wearable device 100 may, optionally, further comprise communications circuit 136, flashlight 122 (contained within packet 120) and/or heat exchanger 134.

Wearable device 100 comprises rechargeable power source 130. The power source may be a power bank (or a number of smaller power cells 130 arranged along the interior of the flexible belt 128). By separating a single larger power cell into several smaller power cells distributed within the belt 128, a large capacity power bank structure can be created without the bulk and volume associated with traditional power banks. The weight and dimensions of the (traditionally big and bulky) power bank can be distributed along the belt (or other wearable), allowing for the user to carry a larger capacity of power bank with reduced effort. The rechargeable power source may be batteries 130 (e.g. high capacity lithium batteries). The individual batteries (or other power cells) 130 may be individually housed 132. The housing 132 for each individual power cell and/or battery 130 may be heat and/or impact resistant. The housing 132 for each individual power cell and/or battery 130 may be removably attached, such that they are individually removable and/or replaceable.

The rechargeable power source 130 may be configured to provide power to the electrical modules by means of a direct wire connection 113 (e.g. for integrated modules), by removable charging cables 112 (e.g. a power hub, see FIG. 4), by outlets 110 (e.g. power outlet), and/or by means of wireless charging.

The rechargeable power source 130 may be charged from a traditional power source, such as a wall power outlet or by other sources of power (e.g. solar panels or generators). The rechargeable power source 130 may obtain this power through connection to an external device (e.g. a generator) or through the use of an electrical module (e.g. a solar panel module).

Additionally, or alternatively, the rechargeable power source 130 may be recharged by capturing and/or converting the user's movement energy (e.g. by capturing the user's walking energy). When the wearable device 100 is in use (e.g. worn by a user), the user's walking energy (or other movement energy) may be captured by an appropriate energy harvesting device (e.g. a piezoelectric generator). The energy harvesting device may be connected to the rechargeable power source 130 as an electrical module or integrated directly into the wearable device 100.

A user may wear a harvesting device on their shoe or foot which captures the downward pressure exerted by the user on each step. This pressure may be captured, for example, by means of a piezoelectric generator, which converts the users walking force into electricity. This electricity can then be used to recharge the rechargeable power source 130. Although energy harvested from walking by means of a piezoelectric generator is used as an exemplary example, it should be appreciated that modules (and/or energy harvesters) may be designed to harvest a user's energy (e.g. kinetic energy) from a variety of different situations. For example, in some embodiments, the rechargeable power source 130 may be recharged by means of a hand crank.

The use of electrical modules and power banks will result in the generation of heat. In some uses (e.g. arctic expeditions), such heat may be desired and thus no heat dissipation may be intentionally provided. In other uses, heat dissipation may be desired due to environmental influences or to keep the user cool. The wearable device 100 may further comprise a heat exchanger 134. The heat exchanger may be connected to the rechargeable power source (or, in some cases, it may be alternately powered). The heat exchanger 134 may be configured to dissipate heat generated from the batteries 130 and/or the electrical modules (e.g. 102, 104) out of the belt 128 and away from the user. Although a conventional fan is shown as the heat exchanger 134 of FIG. 2, it should be appreciated that any comparable heat dissipation method may be equally used (e.g. heatsinks, airflow, water cooling, etc.).

The wearable device 100 may further comprise a communications circuit 136. The communications circuit 136 may be configured to communicate with the mobile device 126 (e.g. via dock 124 connection). The communications circuit 136 may be configured to wirelessly communicate with external mobile devices (e.g. via BlueTooth and/or Wifi). The communications circuit 136 may be configured to control the various electrical modules (e.g. by means of connected mobile device 124) and/or to coordinate the control of multiple electrical modules (e.g. by allowing one connected module to control another). In other words, the communications circuit 136 be configured to detect the connection of any modules (e.g. modular units or active integrated modules), to enable control (or activation/deactivation) of any connected modules, to communicate with external devices and/or to coordinate communication between multiple electrical devices (and/or with other external devices). The communications control 136 may be powered by rechargeable power source 130; for example, by means of a direct wire connection 113.

In some embodiments, the rear side of the elongate strip 128 may comprise a compact flashlight 122 contained within packet 120. In some embodiments, flashlight 122 may be a lantern style flashlight. In an embodiment, the light output from the flashlight 122 can work approximately up to 12 days continuously with the help of the rechargeable power source contained within the wearable device 100 before needing to be recharged.

Figure 3:
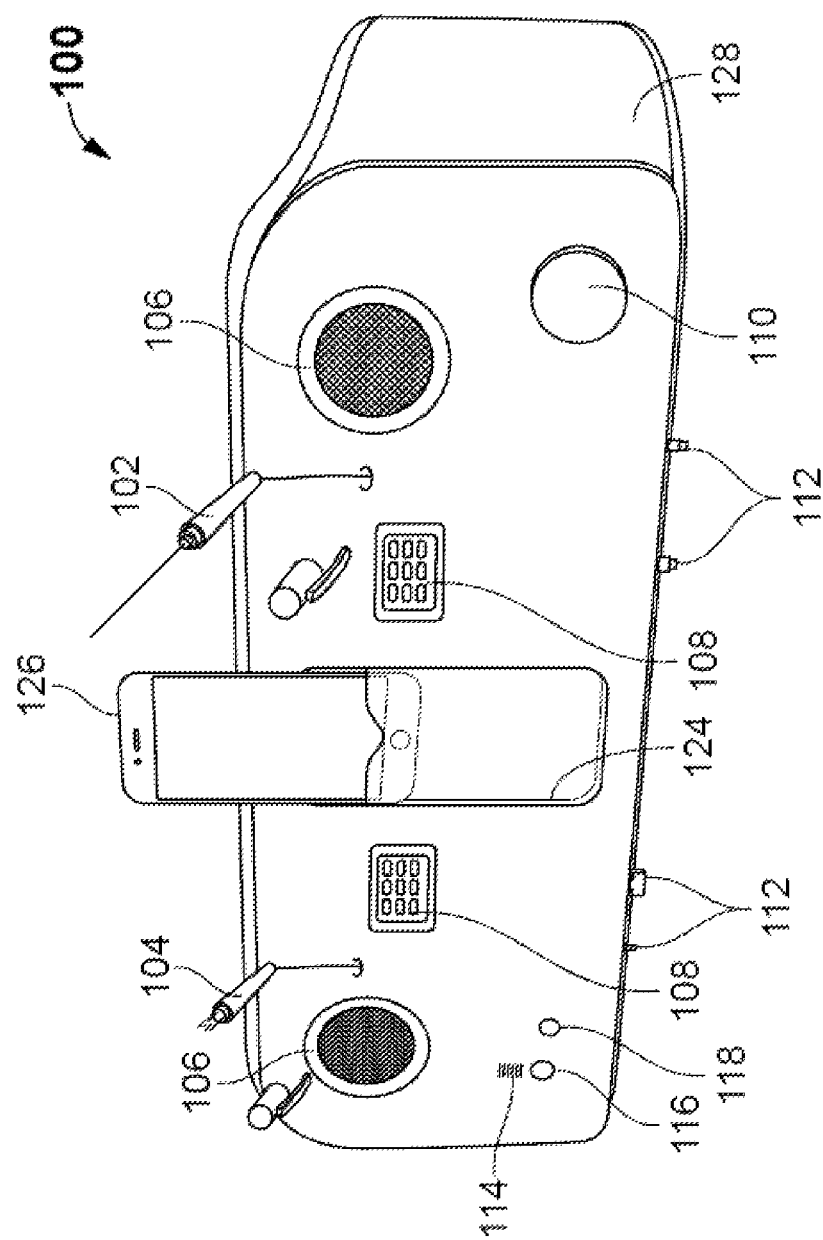
FIG. 3 shows another front view of an example wearable device.

FIG. 3 shows another front view of example wearable device 100 with an exploded view of a laser unit 102 and TASER (electric stun gun) unit 104. The high power visible laser beam 102 may be configured for communication and to display the current location of the user, for example, the current location of camping or location of other utilities in the outdoors. The TASER (electric stun gun) unit 104 may be configured to discharge electrical pulses to incapacitate harmful strangers or animals.

The wearable device 100 may further comprise a plurality of electrical connections 112 (e.g. universal serial bus cable or USB). The electrical connections 112 may be directly connected to the rechargeable power source 130 or they may themselves be modular (e.g. removably attached to the rechargeable power source such that they can be exchanged as required by use or to replace individual parts).

Figure 4:
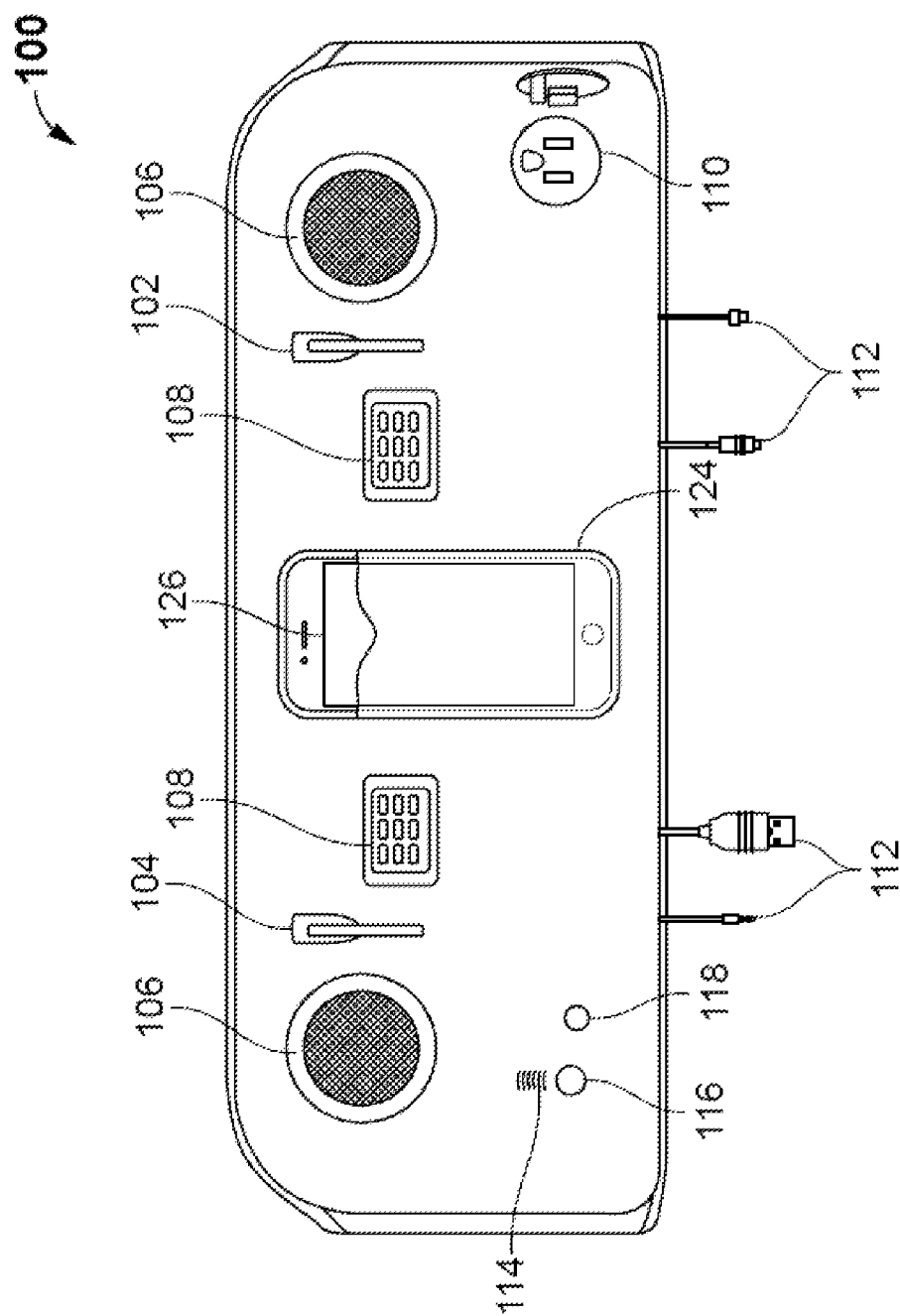
FIG. 4 shows a front view of example power connection modules.

FIG. 4 shows a front view of example power connection modules 112. The electrical connections 112 may be retractable. The electrical modules may "plug in" to the belt 128 directly (e.g. electrical connections 111) or they may connect by means of electrical connections 112.

The foregoing examples have been provided merely to explanation and are in no way to be construed as limiting of the present concept disclosed herein. While the concept has been described with reference to various embodiments, it is understood that the words, which have been used herein, are words of description and illustration, rather than words of limitation. Further, although the concept has been described herein with reference to particular means, materials, and embodiments, the concept is not intended to be limited to the particulars disclosed herein; rather, the concept extends to all functionally equivalent structures, methods and uses, such as are within the scope of the appended claims. Those skilled in the art, having the benefit of the teachings of this specification, may affect numerous modifications thereto and changes may be made without departing from the scope and spirit of the concept in its aspects.

With the increase in the list of items that need to be carried around when people spend time in outdoor, people are susceptible to forget some items to take with them. Also, people need to arrange separate space in their luggage to carry around all the listed items. With the evolution of technology, the above stated equipment such as charger, mosquito repellent, mobile, flashlights, stun gun etc., have been developed in portable form. Even though portable electronic equipments are available in the market, it's not easy for a user to make space for all the items and at the same time remembering to carry the exhaustive list.

For example, if the user wants to charge his/her phone while walking in the beach, then the user will need a device to which the phone can be attached and charged simultaneously while he/she is walking. Such a device can make these outdoor activities memorable, since the device will take care of the additional duties concerning the electronic equipment of the user. Further, there is a need for a device which can provide additional functions, such as, light, sound, etc., while the user is enjoying an outdoor activity. Further, there exists a need for a wearable device capable of performing plurality of functions such as charging electronic equipment, protect themselves from being harmed by strangers or animals, entertainment via music players, and additional functionalities such as light, sound etc.

Conventional powerbanks and battery packs come in solid structure shapes. The present disclosure is a flexible, wearable and modular power platform. For example, a wearable belt with:

1: Built-in rechargable batteries, could be lithium, polymer or any rechargable batteries (can be replacable or removable). Each battery is inside the heatsink shell; 2: one or more built-in bullet micro fans, that they'll activated when batteries or components temperature is higher than certain point to balance the temperature (like a laptop); 3: modular power gate (jack) all the active modules connecting here; 4: power capacity indicator; 5: red blinking LED's on the back of the belt; 6: each battery shell (contain the battery) individually is limited and covered by durable and heat resistant fabric housing for more safety if any incident happens (explosion or damages) to any battery, does not affect the other neighbors (other batteries).

Modules (integrated or modular): microphone; speakers; laser signal visible beam; TASER (electric stun gun) device; audio jack in/out; retractable charging cables; flexible solar sheet charger; 110 v/220 v Ac outlet; flashlights, dimmable/zoomable; waterproof pouch and phone case; GPS tracking; built-in mosquito repellent board; one or more pair flashlights.

Active and passive modules: any active modules comes with in and out ports ("in" port will be attached to the "modular power gate on the belt) and "out" port is able to connect to the other active modules to operate.

The present disclosure is modular, designed to charge any electronics and gadgets, (just attach the right modules to charge any specific devices) such as cameras, phones, laptops, games, drones, gadgets, etc. An optional waterproof pouch module that may holds your phone within easy reach. Powerful speakers. Retractable Charging cables for things like your camera, smartphone, and even drone and laptops. Ultra-Bright LEDs to light the path for you in total darkness. May also contains a mosquito repellant that uses ultrasonic frequencies to scare away mosquitoes at the push of a button . . . .

Velcro designed Modules such as: water bottle cup holder, AC outlet, A fanny pouch, visible beam laser signal, GPS tracking, Solar charger.

REFERENCE NUMERALS LIST

100—Wearable Device
101—Removable Electrical Module

102—Laser
104—TASER (electric stun gun)
106—Speakers
108—Switches
110—Outlet
111—Modular Electrical Connections
112—Retractable Electrical Connections
113—Wired Electrical Connections
114—Charging display
116—Power button
118—Insect repellent
120—Packet
122—Flashlight
124—Dock
126—Mobile Device
128—Flexible belt
130—Rechargeable power source
132—Housing for power source
134—Heat Exchanger
136—Communications circuit

What is claimed is:

1. A wearable multifunction power bank, comprising:
a flexible belt;
a rechargeable power source contained within the flexible belt, wherein the rechargeable power source comprises a plurality of power cells distributed along the flexible belt, wherein each power cell is individually housed in an impact or heat resistant housing and wherein the individually housed power cells are removably attached to the belt; and
one or more electrical modules attached to the belt,
wherein the rechargeable power source is configured to provide power to the electrical modules via the removably attached power cells.

2. The wearable multifunction power bank of claim 1, further comprising a communications circuit configured to communicate with the one or more electrical modules or other external devices.

3. The wearable multifunction power bank of claim 1, wherein the power source is configured to provide power to the electrical modules by at least wireless charging.

4. The wearable multifunction power bank of claim 1, further comprising a heat exchanger connected to the power source and configured to dissipate heat from the power source or flexible belt.

5. The wearable multifunction power bank of claim 1, wherein one of the one or more electrical modules are powered by a source other than the rechargeable power source.

6. The wearable multifunction power bank of claim 1, wherein one or more of the electrical modules are housed in at least one modular housing removably attached to the flexible belt.

7. The wearable multifunction power bank of claim 1, wherein one or more of the utility modules are integrated into the flexible belt.

8. The wearable multifunction power bank of claim 1, wherein the electrical modules are housed in a protective housing.

9. The wearable multifunction power bank of claim 1, wherein the one or more electrical modules comprise at least one of an audio module, a speaker, a microphone, or an audio I/O circuit.

10. The wearable multifunction power bank of claim 1, wherein the one or more electrical modules comprise at least one of an insect repellant circuit or an electric stun gun.

11. The wearable multifunction power bank of claim 1, wherein the one or more electrical modules comprise at least one of a light source, a laser beam or a flashlight.

12. The wearable multifunction power bank of claim 1, wherein the one or more electrical modules comprise at least one of a GPS or an emergency locator beacon.

13. The wearable multifunction power bank of claim 1, wherein the one or more electrical modules comprise at least one of charging cables, power outlets, or wireless chargers.

14. The wearable multifunction power bank of claim 1, wherein the one or more electrical modules comprise a solar panel.

15. The wearable multifunction power bank of claim 1, wherein the flexible belt further comprises a back support.

16. The wearable multifunction power bank of claim 1, wherein the rechargeable power source is recharged from power generated through the user's motion.

17. The wearable multifunction power bank of claim 16, wherein the power is generated from the user's steps.

* * * * *